United States Patent
Naruse et al.

[19]

[11] Patent Number: 6,014,408
[45] Date of Patent: Jan. 11, 2000

[54] PN CODE GENERATING CIRCUIT AND TERMINAL UNIT

[75] Inventors: Tetsuya Naruse, Chiba; Takashi Usui, Tokyo, both of Japan

[73] Assignee: Sony Corporation, Tokyo, Japan

[21] Appl. No.: 08/989,512

[22] Filed: Dec. 12, 1997

[30] Foreign Application Priority Data

Dec. 27, 1996 [JP] Japan .................................. 8-350341

[51] Int. Cl.[7] ................ G06F 1/02; H04B 1/69; H04K 1/00; H04L 9/00
[52] U.S. Cl. ............ 375/208; 375/200; 341/187; 364/717.01; 364/717.03; 364/717.04
[58] Field of Search ................... 375/200, 206, 375/208, 367, 343, 209, 210, 207, 324, 368, 201, 316, 340; 370/342, 335, 319, 320, 321, 324, 203, 208, 515, 537, 498; 380/34, 9, 33, 46, 44, 42, 48; 364/717.01, 717.02, 717.03, 717.04, 717.05, 717.06, 717.07; 327/152, 144, 141; 377/70, 64, 54; 331/78; 341/173, 187

[56] References Cited

U.S. PATENT DOCUMENTS 4,493,046 1/1985 Watanabe .............................. 364/717
5,228,054 7/1993 Reuth et al. .............................. 375/1
5,532,695 7/1996 Park et al. .............................. 341/173

*Primary Examiner*—William Luther
*Attorney, Agent, or Firm*—Jay H. Maioli

[57] ABSTRACT

A Pseudorandom Noise (PN) code generating circuit includes a shift register, an adding circuit for exclusive-ORing tap output data of the shift register and feed-back output data of the shift register, selectors disposed as upstream circuits of each register composing the shift register, phase designating circuits for selectively obtaining tap output data of the shift register corresponding to mask data for designating the phase of the PN code, and a data storing device for storing the initial data and the mask data. When the initial data is set to the shift register, the initial data is stored in the data storing device and the initial data is set to each register of the shift register through the selectors. When the PN code is generated, the selectors send data stored in each register of the shift register so as to generate the PN code and the data storing device stores the mask data. Tap output data of the shift register is selectively obtained corresponding to the mask data.

1 Claim, 8 Drawing Sheets

PN CODE GENERATING CIRCUIT AND TERMINAL UNIT

BACKGROUND OF THE INVENTION

1. Field of the Invention

The present invention relates to a PN code generating circuit suitable for a CDMA (Code Division Multiple Access) type cellular telephone system and a terminal unit for use with a radio system thereof.

2. Description of the Related Art

In recent years, a CDMA type cellular telephone system has become attractive. In the CDMA type cellular telephone system, a pseudo-random code is used as a spread code. A carrier of a transmission signal is spectrum-spread. The pattern and phase of each spread code in the code sequence are varied so as to perform a multiple access.

In the CDMA system, the spectrum spread method is used. In the spectrum spread system, when data is transmitted, the carrier is primarily modulated with the transmission data. In addition, the carrier that has been primarily modulated is multiplied by a PN (Pseudorandom Noise) code. Thus, the carrier is modulated with the PN code. As an example of the primarily modulating method, balanced QPSK modulating method is used. Since the PN code is a random code, when the carrier is modulated by the PN code, the frequency spectrum is widened.

When data is received, the received data is multiplied by the same PN code that has been modulated on the transmission side. When the same PN code is multiplied and the phase is matched, the received data is de-spread and thereby primarily modulated data is obtained. When the primarily modulated data is demodulated, the original data is obtained.

In the spectrum spread method, to de-spread the received signal, the same PN code that has been modulated on the transmission side is required for both the pattern and the phase. Thus, when the pattern and the phase of the PN code are varied, the multiple access can be performed. The method for varying the pattern and the phase of each spread code in the code sequence and thereby performing the multiple access is referred to as the CDMA method.

As cellular telephone systems, an FDMA (Frequency Division Multiple Access) system and a TDMA (Time Division Multiple Access) system have been used. However, the FDMA system and the TDMA system cannot deal with a drastic increase of the number of users.

In other words, in the FDMA system, the multiple access is performed on different frequency channels. In an analog cellular telephone system, the FDMA system is usually used.

However, in the FDMA system, since the frequency use efficiency is bad, a drastic increase of the number of users tends to cause channels to run short. When the intervals of channels are narrowed for the increase of the number of channels, the adjacent channels adversely interfere with each other and thereby the sound quality deteriorates.

In the TDMA system, the transmission data is compressed on the time base. Thus, the use time is divided and thereby the same frequency is shared. The TDMA system has been widely used as a digital cellular telephone system. In the TDMA system, the frequency use efficiency is improved in comparison with the simple FDMA system. However, in the TDMA system, the number of channels is restricted. Thus, it seems that as the number of users drastically increases, the number of channels runs short.

On the other hand, the CDMA system has excellent interference resistance. Thus, in the CDMA system, adjacent channels do not interfere with each other. Consequently, the frequency use efficiency improves and more channels can be obtained.

In the FDMA system and the TDMA system, signals tend to be affected by fading due to multi-paths.

In other words, as shown in FIG. 5, a signal is sent from a base station 201 to a portable terminal unit 202 through a plurality of paths. In addition to a path P1 in which a radio wave of the base station 201 is directly sent to the portable terminal unit 202, there are a path P2, a path P3, and so forth. In the path P2, the radio wave of the base station 201 is reflected by a building 203A and sent to the portable terminal unit 202. In the path P3, the radio wave of the base station 201 is reflected by a building 203B and sent to the portable terminal unit 202.

The radio waves that are reflected by the buildings 203A and 203B and sent to the portable terminal unit 202 through the paths P2 and P3 are delayed from the radio wave that is directly sent from the base station 201 to the portable terminal unit 202 through the path P1. Thus, as shown in FIG. 6, signals S1, S2, and S3 reach the portable terminal unit 202 through the paths P1, P2, and P3 at different timings, respectively. When the signals S1, S2, and S3 through the paths P1, P2, and P3 interfere with each other, a fading takes place. In the FDMA system and the TDMA system, the multi-paths cause the signal to be affected by the fading.

On the other hand, in the CDMA system, with the diversity RAKE method, the fading due to the multi-paths can be alleviated and the S/N ratio can be improved.

In the diversity RAKE system, as shown in FIG. 7, receivers 221A, 221B, and 221C that receive signals S1, S2, and S3 through the paths P1, P2, and P3 are disposed, respectively. A timing detector 222 detects codes received through the individual paths. The codes are set to the receivers 221A, 221B, 221C corresponding to the paths P1, P2, and P3, respectively. The receivers 221A, 221B, and 221C demodulate the signals received through the paths P1, P2, and P3. The received output signals of the receivers 221A, 221B, and 221C are combined by a combining circuit 223.

In the spectrum spread system, signals received through different paths are prevented from interfering with each other. The signals received through the paths P1, P2, and P3 are separately demodulated. When the demodulated output signals received through the respective paths are combined, the signal intensity becomes large and the S/N ratio improves. In addition, the influence of the fading due to the multi-paths can be alleviated.

In the above-described example, for simplicity, with the three receivers 221A, 221B, and 221C and the timing detector 222, the structure of the diversity RAKE system was shown. However, in reality, in a cellular telephone terminal unit of the diversity RAKE type, as shown in FIG. 8, fingers 251A, 251B, and 251C, a searcher 251, and a data combiner 253 are employed. The fingers 251A, 251B, and 251C obtain demodulated output signals for the respective paths. The searcher 252 detects signals received over the multi-paths. The combiner 253 combines the demodulated data for the respective paths.

In FIG. 8, a received signal as a spectrum spread signal that has been converted into an intermediate frequency is supplied to an input terminal 250. This signal is supplied to a sub-synchronous detecting circuit 255. The sub-synchronous detecting circuit 255 is composed of a multiplying circuit. The sub-synchronous detecting circuit 255 multiplies a signal received from the input terminal 250 by an output signal of a PLL synthesizer 256. An output signal of the PLL synthesizer 256 is controlled with an output signal of a frequency combiner 257. The sub-synchronous detecting circuit 255 performs a quadrature detection for the received signal.

An output signal of the sub-synchronous detecting circuit 255 is supplied to an A/D converter 258. The A/D converter 258 converts the input signal into a digital signal. At this point, the sampling frequency of a controller 254 is much higher than the frequency of the PN code that is spectrum-spread. In other words, the input signal of the A/D converter 258 is over-sampled.

An output signal of the controller 254 is supplied to the fingers 251A, 251B, and 251C. In addition, the output signal of the controller 254 is supplied to the searcher 252. The fingers 251A, 251B, and 251C de-spread the signals received through the respective paths, synchronize the signals, acquire the synchronization of the received signals, demodulate the data of these signals, and detect frequency errors of the signals.

The searcher 252 acquires the codes of the received signals and designates the codes of the paths to the fingers 251A, 251B, and 251C. In other words, the searcher 252 has a de-spreading circuit that multiplies a received signal by a PN code and de-spreads the signal. In addition, the searcher 252 shifts the phase of the PN code and obtains the correlation with the received code under the control of the controller 254. With the correlation between a designated code and a received code, a code for each path is determined.

An output signal of the searcher 252 is supplied to the controller 254. The controller 254 designates the phases of the PN codes for the fingers 251A, 251B, and 251C corresponding to the output signal of the searcher 252. The fingers 251A, 251B, and 251C de-spread the received signals and demodulate the received signals received through the respective phases corresponding to the designated phases of the PN codes.

The demodulated data is supplied from the fingers 251A, 251B, and 251C to the data combiner 253. The data combiner 253 combines the received signals received through the respective paths. The combined signal is obtained from an output terminal 259.

The fingers 251A, 251B, and 251C detect frequency errors. The frequency errors are supplied to the frequency combiner 257. With an output signal of the frequency combiner 257, the oscillation frequency of the PLL synthesizer 256 is controlled.

In FIG. 9, registers 301A, 301B, 301C, and so forth and modulo-2' adding circuits 302A, 302B, and so forth compose an M sequence generating circuit. The registers 301A, 301B, 301C, and so forth are shift registers. The modulo-2' adding circuits 302A, 302B, and so forth exclusive-OR tap output signals of the shift registers and feed-back output signals thereof. Selectors 303A, 303B, 303C, and so forth are disposed as upstream circuits of the registers 301A, 301B, 301C, and so forth, respectively. A select signal is supplied to the selectors 303A, 303B, 303C, and so forth through a signal line 308. The select signal causes the selectors 303A, 303B, 303C, and so forth to be switched depending on whether data is loaded or a PN code is generated.

Load data is supplied to a data bus 309. The load data is temporarily stored in registers 304A, 304B, 304C, and so forth.

When data is loaded, the selectors 303A, 303B, 303C, and so forth are switched to a terminal Sb thereof. When the selectors 303A, 303B, 303C, and so forth are switched to the terminal Sb, the load data that has been temporarily stored in the registers 304A, 304B, 304C, and so forth are supplied as initial data to the registers 301A, 301B, 301C, and so forth.

When a PN code is generated, the selectors 303A, 303B, 303C, and so forth are switched to a terminal Sa thereof. When the selectors 303A, 303B, 303C, and so forth are switched to the terminal Sa, the registers 301A, 301B, 301C, and so forth and the modulo-2's adding circuits 302A, 302B, and so forth form an M sequence generating circuit that generates a PN code.

AND gates 305A, 305B, 305C, and so forth and an OR gate form a selector that selects the phase of the PN code. Tap output data of the registers 301A, 301B, 301C, and so forth that generates the PN code is supplied to first input terminals of the AND gates 305A, 305B, 305C, and so forth. Output data of registers 310A, 310B, 310C, and so forth is supplied to second input terminals of the AND gates 305A, 305B, 305C, and so forth. Output data of the AND gates 305A, 305B, 305C, and so forth is supplied to the OR gate 306. Output data of the OR gate 306 is obtained from an output terminal 307.

When the PN code is generated, mask data is supplied through a mask data bus 311. The mask data is temporarily stored in the registers 310A, 310B, 310C, and so forth. The mask data is supplied to the AND gates 305A, 305B, 305C, and so forth. The mask data causes an output tap of the registers 301A, 301B, 301C, and so forth to be selected, thereby designating the phase of the PN code.

As described above, in the conventional PN code generating circuit, the registers 301A, 301B, 301C, and so forth have the registers 304A, 304B, 304C, and so forth, which store initial data, and the registers 310A, 310B, 310C, and so forth, which store mask data for designating the phase of the PN code, respectively. Thus, the circuit scale of the PN code generating circuit becomes large.

OBJECTS AND SUMMARY OF THE INVENTION

Therefore, an object of the present invention is to provide a PN code generating circuit having registers that are shared with registers that store initial data for generating a PN code and registers that store mask data for designating the phase of the PN code, thereby reducing the circuit scale.

A first aspect of the present invention is a PN code generating circuit, comprising a shift register, an adding circuit for exclusive-ORing tap output data of the shift register and feed-back output data of the shift register, selectors, disposed as upstream circuits of each register composing the shift register, for switching respective input terminals depending on whether initial data is stored to the shift register or a PN code is generated, a phase designating means for selectively obtaining tap output data of the shift register corresponding to mask data for designating the phase of the PN code, and a data storing means for storing the initial data and the mask data, wherein when the initial data is set to the shift register, the initial data is stored in the data storing means and the initial data is set to each register of the shift register through the selectors, and wherein when the PN code is generated, the selectors send data stored in each register of the shift register so as to generate the PN code and the data storing means stores the mask data, tap output data of the shift register being selectively obtained corresponding to the mask data.

A second aspect of the present invention is a terminal unit for use with a radio system for spectrum-spreading data with a PN spread code, varying the pattern and phase of a spread code sequence, and performing multiple access, the terminal unit having a PN code generating circuit, comprising a shift register, an adding circuit for exclusive-ORing tap output data of the shift register and feed-back output data of the shift register, selectors, disposed as upstream circuits of each register composing the shift register, for switching respective input terminals depending on whether initial data is stored to the shift register or a PN code is generated, a phase designating means for selectively obtaining tap output data of the shift register corresponding to mask data and designating the phase of the PN code, and a data storing means for storing the initial data and the mask data, wherein when the initial data is set to the shift register, the initial data is stored in the data storing means and the initial data is set to each register of the shift register through the selectors, and wherein when the PN code is generated, the selectors send data stored in each register of the shift register so as to generate the PN code and the data storing means stores the mask data, tap output data of the shift register being selectively obtained corresponding to the mask data.

When initial data is set, load data is supplied through the data bus. The load data causes initial data to be stored to registers. When a PN code is generated, mask data for designating the phase of the PN code is supplied through the data bus. The mask data is stored in the registers. Thus, since the registers that store the load data are shared with the register that store the mask data, the circuit scale is reduced.

These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENTS

Figure 1:
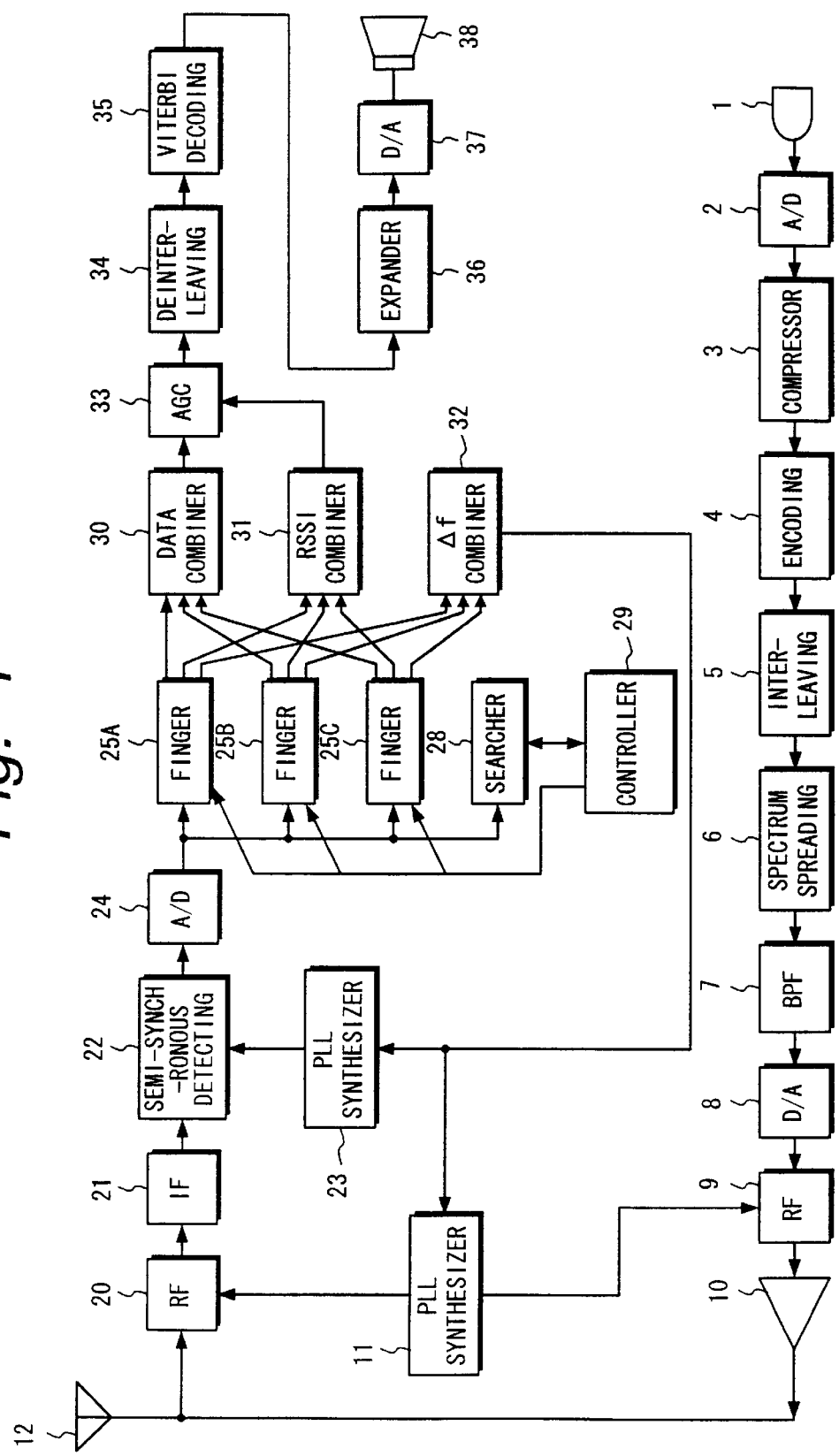
FIG. 1 is a block diagram showing the overall structure of a portable telephone terminal unit of CDMA type according to the present invention.

With reference to the accompanying drawings, an embodiment of the present invention will be described. FIG. 1 is a block diagram showing an example of a portable terminal unit for use with a cellular telephone system of CDMA type according to the present invention. The portable terminal unit uses diversity RAKE system as the receiving system. In the diversity RAKE system, signals are received from a plurality of paths at the same time. The received signals are combined.

In FIG. 1, in the transmission mode, an audio signal is input to a microphone 1. The audio signal is supplied to an A/D converter 2. The A/D converter 2 converts an analog audio signal into a digital audio signal. An output signal of the A/D converter 2 is supplied to an audio compressing circuit 3. The audio compressing circuit 3 compresses and encodes the digital audio signal. As examples of the compressing and encoding system, various types have been proposed. For example, a system such as QCELP (Qualcomm Code Excited Linear Coding) system can be used. In the QCELP system, depending on the characteristics of the sound of the user and the congestion state of the communication path, a plurality of encoding speeds can be used. In this case, four encoding speeds (9.6 kbps, 4.8 kbps, 2.4 kbps, and 1.2 kbps) can be selected. To maintain the communication quality, data can be encoded at the minimum speed. It should be noted that the audio compressing system is not limited to the QCELP system.

An output signal of the audio compressing circuit 3 is supplied to a convolutional encoding circuit 4. The convolutional encoding circuit 4 adds an error correction code as a convolutional code to the transmission data. An output signal of the convolutional encoding circuit 4 is supplied to an interleaving circuit 5. The interleaving circuit 5 interleaves the transmission data. An output signal of the interleaving circuit 5 is supplied to a spectrum spreading circuit 6.

The spectrum spreading circuit 6 primarily modulates the carrier and spreads the resultant signal with a PN code. In other words, the spectrum spreading circuit 6 primarily modulates the transmission data corresponding to for example balanced QPSK modulating method. In addition, the resultant signal is multiplied by a PN code. Since the PN code is a random code, when the PN code is multiplied, the frequency band of the carrier is widened. Thus, the carrier is spectrum-spread. As an example of the modulating method for the transmission data, the balanced QPSK modulating method is used. However, another modulating method can be used along with other various methods that have been proposed.

An output signal of the spectrum spreading circuit 6 is supplied to a D/A converter 8 through a band pass filter 7. An output signal of the D/A converter 8 is supplied to an RF circuit 9.

A local oscillation signal is supplied from a PLL synthesizer 11 to the RF circuit 9. The RF circuit 9 multiplies the output signal of the D/A converter 8 by the local oscillation signal of the PLL synthesizer 11 and thereby converts the frequency of the transmission signal into a predetermined frequency. An output signal of the RF circuit 9 is supplied to a transmission amplifier 10. After the power of the transmission signal is amplified, the resultant signal is supplied to an antenna 12. A radio wave is sent from the antenna 12 to a base station.

In the reception mode, a radio wave sent from a base station is received by the antenna 12. Since the radio wave sent from the base station is reflected by buildings and so forth, the radio wave reaches the antenna 12 of the portable terminal unit through multi-paths. When the portable terminal unit is used in a car or the like, the frequency of the received signal may vary due to the Doppler effect.

The output signal of the antenna 12 is supplied to an RF circuit 20. The RF circuit 20 receives a local oscillation signal from the PLL synthesizer 11. The RF circuit 20 converts the received signal into an intermediate frequency signal with a predetermined frequency.

An output signal of the RF circuit 20 is supplied to a semi-synchronous detecting circuit 22 through an intermediate frequency circuit 21. An output signal of a PLL synthesizer 23 is supplied to the semi-synchronous detecting circuit 22. The frequency of the output signal of the PLL synthesizer 23 is controlled with an output signal of a frequency combiner 32. The semi-synchronous detecting circuit 22 quadrature-detects the received signal.

An output signal of the semi-synchronous detecting circuit 22 is supplied to an A/D converter 24. The A/D converter 24 digitizes the output signal of the semi-synchronous detecting circuit 22. At this point, the sampling frequency of the A/D converter 24 is higher than the frequency of the PN code that has been spectrum-spread. In other words, the input signal of the A/D converter is over-sampled. An output signal of the A/D converter 24 is supplied to fingers 25A, 25B, and 25C. In addition, the output signal of the A/D converter 24 is supplied to a searcher 28.

As described above, in the reception mode, signals are received through multi-paths. The fingers 25A, 25B, and 25C multiply the signals received through the multi-paths by the PN code so as to de-spread the received signals. In addition, the fingers 25A, 25B, and 25C output the levels of the signals received through the multi-paths and the frequency errors of these multi-paths.

The searcher 28 acquires the codes of the received signals and designates the codes for the paths. In other words, the searcher 28 has a de-spreading circuit that multiplies the received signals by the respective PN codes and de-spreads the received signals. The searcher 28 shifts the phases of the PN codes under the control of a controller 29 and obtains the correlation with the received codes. With the correlation values of the designated codes and the received codes, the codes for the respective paths are designated. The codes designated by the controller 29 are supplied to the fingers 25A, 25B, and 25C.

The received data for the respective paths demodulated by the fingers 25A, 25B, and 25C is supplied to a data combiner 30. The data combiner 30 combines the received data for the respective paths. An output signal of the data combiner 30 is supplied to an AGC circuit 33.

The fingers 25A, 25B, and 25C obtain the intensities of the signals received through the respective paths. The intensities of the signals received through the respective paths are supplied from the fingers 25A, 25B, and 25C to a RSSI combiner 31. The RSSI combiner 31 combines the intensities of the signals received through the respective paths. An output signal of the RSSI combiner 31 is supplied to the AGC circuit 33. The gain of the AGC circuit 33 is controlled so that the signal level of the received data becomes constant.

The frequency errors for the respective paths are supplied from the fingers 25A, 25B, and 25C to the frequency combiner 32. The frequency combiner 32 combines the frequency errors for the respective paths. An output signal of the frequency combiner 32 is supplied to the PLL synthesizers 11 and 23. Corresponding to the resultant frequency error, the frequencies of the PLL synthesizers 11 and 23 are controlled.

An output signal of an AGC circuit 33 is supplied to a de-interleaving circuit 34. The de-interleaving circuit 34 de-interleaves the received data that has been interleaved on the transmission side. An output signal of the de-interleaving circuit 34 is supplied to a Viterbi decoding circuit 35. The Viterbi decoding circuit 35 decodes a convolutional code with a soft determining process and a maximum likelihood decoding process. The Viterbi decoding circuit 35 performs an error correcting process. An output signal of the Viterbi decoding circuit 35 is supplied to an audio expanding circuit 36.

The audio expanding circuit 36 decompresses the audio signal that has been compressed with, for example, the QCELP method and decodes a digital audio signal. The digital audio signal is supplied to a D/A converter 37. The D/A converter 37 restores a digital audio signal to an analog audio signal. The analog audio signal is supplied to a speaker 38.

Figure 2:
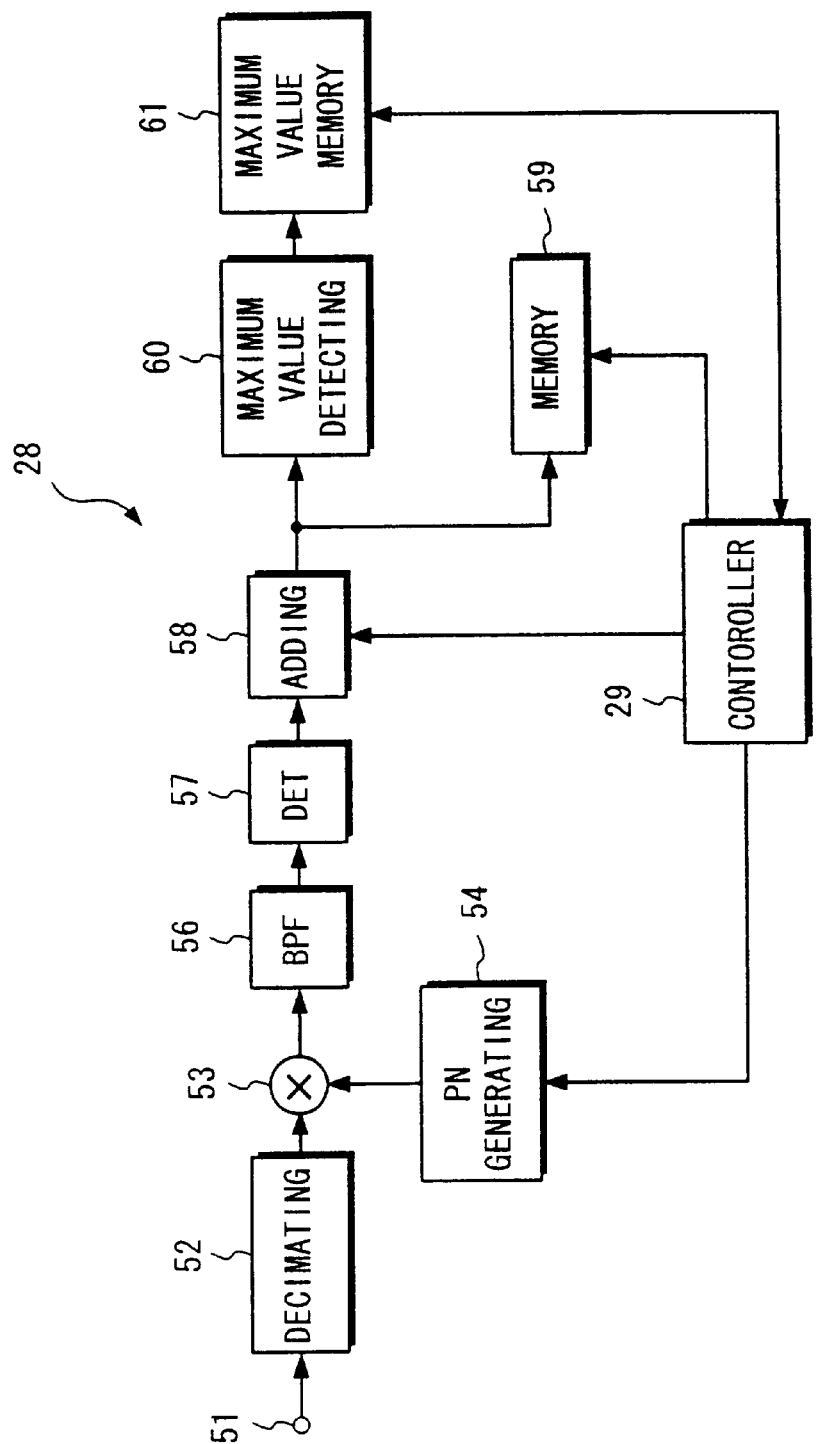
FIG. 2 is a block diagram showing an example of the structure of a searcher of the portable telephone terminal unit of CDMA type according to the present invention.

FIG. 2 is a block diagram showing the structure of the searcher 28 of the portable telephone terminal unit according to the present invention. In FIG. 2, a digital signal is supplied from the A/D converter 24 (see FIG. 1) to an input terminal 51. As described above, the sampling frequency of the A/D converter 24 is higher than the frequency of a PN code. In other words, the digital signal is over-sampled. The digital signal is supplied from the input terminal 51 to a decimating circuit 52. The decimating circuit 52 decimates the signal received from the input terminal 51. An output signal of the decimating circuit 52 is supplied to a multiplying circuit 53.

A PN code generating circuit 54 generates a PN code that used to spectrum spread on the transmission side. The phase of the PN code received from the PN code generating circuit 54 can be designated by a controller 29. The PN code received from the PN code generating circuit 54 is supplied to the multiplying circuit 53.

The multiplying circuit 53 multiplies the output signal of the decimating circuit 52 by the PN code received from the PN code generating circuit 54. Thus, the received signal from the input terminal 51 de-spreads. When the pattern and the phase of the received code match the pattern and the phase of the code received from the PN code generating circuit 54, the received signal de-spreads. Thus, the level of an output signal of the multiplying circuit 53 becomes large. The output signal of the multiplying circuit 53 is supplied to a level detecting circuit 57 through a band pass filter 56. The level detecting circuit 57 detects the level of the output signal of the multiplying circuit 53.

An output signal of the level detecting circuit 57 is supplied to an adding circuit 58. The adding circuit 58 accumulates output data a predetermined number of times (for example, 64 times). With the accumulated value of the output data of the level detecting circuit 57, correlation values of the code designated to the PN code generating circuit 54 and the received code are obtained. An output signal of the adding circuit 58 is supplied to a memory 59. In addition, the output signal of the adding circuit 58 is supplied to a maximum value detecting circuit 60. The maximum value detecting circuit 60 obtains the maximum value of the correlation values. The maximum value of the correlation value is stored in a maximum value memory 61.

The phase of the PN code received from the PN code generating circuit 54 is shifted every predetermined number of chips (for example, every chip or every ½ chip). The correlation values are obtained from the output signal of the adding circuit 58 for each phase. The correlation value is stored in the memory 59. After the PN code has been designated for one period, for example three phases with the largest correlation values are selected. The selected phases are designated to the fingers 25A, 25B, and 25C (see FIG.

1). When the three phases are selected in the order of the larger correlation values and three paths are designated, the maximum value stored in the maximum value memory 61 is used.

Figure 3:
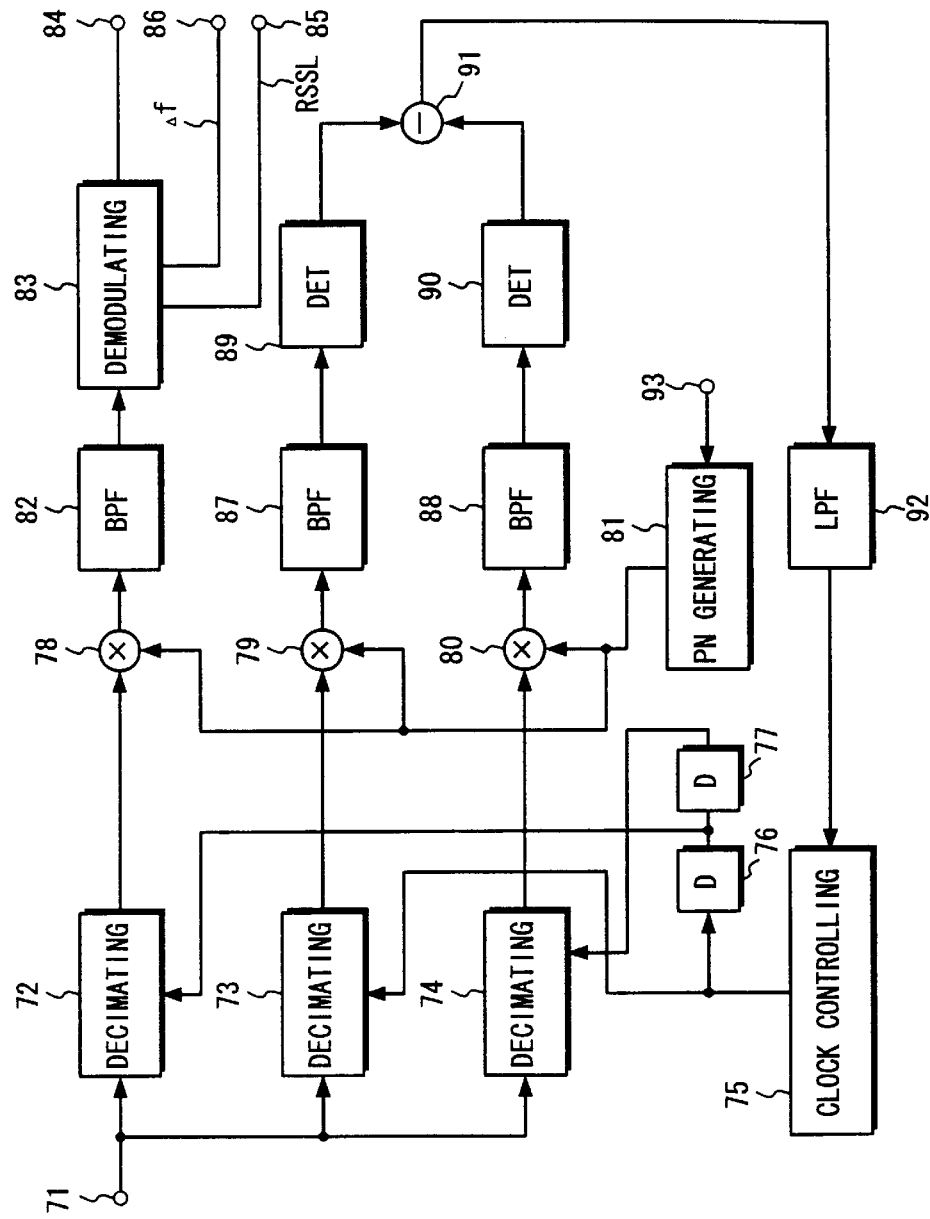
FIG. 3 is a block diagram showing an example of the structure of a finger of the portable telephone terminal unit of CDMA type according to the present invention.

FIG. 3 is a block diagram showing the structure of each of the fingers 25A, 25B, and 25C of the portable telephone terminal unit according to the present invention. In FIG. 3, a digital signal is supplied from the A/D converter 24 (see FIG. 1) to an input terminal 71. As described above, the sampling frequency of the A/D converter 24 is higher than the frequency of the PN code. In other words, the digital signal is over-sampled.

The digital signal is supplied from the input terminal 71 to decimating circuits 72, 73, and 74. A clock is supplied from a clock controlling circuit 75 to the decimating circuit 72 through a delaying circuit 76. The clock from the clock controlling circuit 75 is directly supplied to the decimating circuit 73. The clock from the clock controlling circuit 75 is supplied to the decimating circuit 74 through delaying circuits 76 and 77. Each of the delaying circuits 76 and 77 has a delay amount for ½ chip. The decimating circuits 72, 73, and 74 decimate the digital signal received from the input terminal 71.

Output signals of the decimating circuits 72, 73, and 74 are supplied to multiplying circuits 78, 79, and 80, respectively. The PN code is supplied from a PN code generating circuit 81 to the multiplying circuits 78, 79, and 80. The PN code generating circuit 81 generates the same PN code that used to spectrum spread on the transmission side.

The multiplying circuit 78 multiplies the output signal of the decimating circuit 72 by an output signal of the PN code generating circuit 81. When the pattern and the phase of the received code match the pattern and the phase of the code received from the PN code generating circuit 81, the multiplying circuit 78 outputs a de-spread signal. An output signal of the multiplying circuit 78 is supplied to a demodulating circuit 83 through a band pass filter 82.

The demodulating circuit 83 demodulates the received signal. The demodulating circuit 83 outputs demodulated data. The demodulated data is output from an output terminal 84. The demodulating circuit 83 detects the level of the received signal. The signal level is obtained from an output terminal 85. The demodulating circuit 83 detects a frequency error. The frequency error is obtained from an output terminal 86.

The multiplying circuits 79 and 80 multiply output signals of the decimating circuits 73 and 74 by the output signal of the PN code generating circuit 81, respectively. The clock of the clock controlling circuit 75 is directly supplied to the decimating circuit 73. The clock supplied from the clock controlling circuit 75 to the decimating circuit 74 is delayed by one chip. Assuming that the phase of the output signal of the decimating circuit 72 is the center phase, an output signal with a phase advanced by ½ chip from the center phase and an output signal with a phase delayed by ½ chip from the center phase are obtained from the decimating circuits 73 and 74, respectively. The multiplying circuits 79 and 80 multiply the signal with the phase advanced by ½ chip from the center phase and the signal with the phase delayed by ½ chip from the center phase by the code received from the PN code generating circuit 81. Thus, de-spread output signals with the phases advanced by ½ chip and delayed by ½ chip from the center phase are obtained. Output signals of the multiplying circuits 79 and 80 are used to form a DLL (Delay Locked Loop).

In other words, the output signals of the multiplying circuits 79 and 80 are supplied to level detecting circuits 89 and 90 through bandpass filters 87 and 88, respectively. The level detecting circuits 89 and 90 output the levels of the de-spread signals with the phases advanced by ½ chip and delayed by ½ chip. Output signals of the level detecting circuits 89 and 90 are supplied to a subtracting circuit 91.

The subtracting circuit 91 compares the level of the de-spread signal with the phase advanced by ½ chip and the level of the de-spread signal with the phase delayed by ½ chip. An output signal of the subtracting circuit 91 is supplied to the clock controlling circuit 75 through a loop filter 92. The clock controlling circuit 75 controls the clock supplied to the decimating circuits 72 to 74 so that the level of the output signal of the subtracting circuit 91 becomes zero.

Assuming that an input signal is over-sampled eight times by the A/D converter 24 and that the resultant signal is ⅛ decimated by the decimating circuits 72 to 74, the decimating circuits 72 to 74 output signals at intervals of every eight samples. When it is determined that the current timing is very late corresponding to the output signal of the subtracting circuit 91, the signal is output at intervals of every seven samples instead of every eight samples. Thus, the phase of the signal is advanced.

Initial phase data is supplied from an input terminal 93 to the PN code generating circuit 81. The initial phase data is designated corresponding to a path detected by the searcher 28. Corresponding to the fluctuation of the code, the above-described DLL loop operates so as to acquire the received code.

Figure 4:
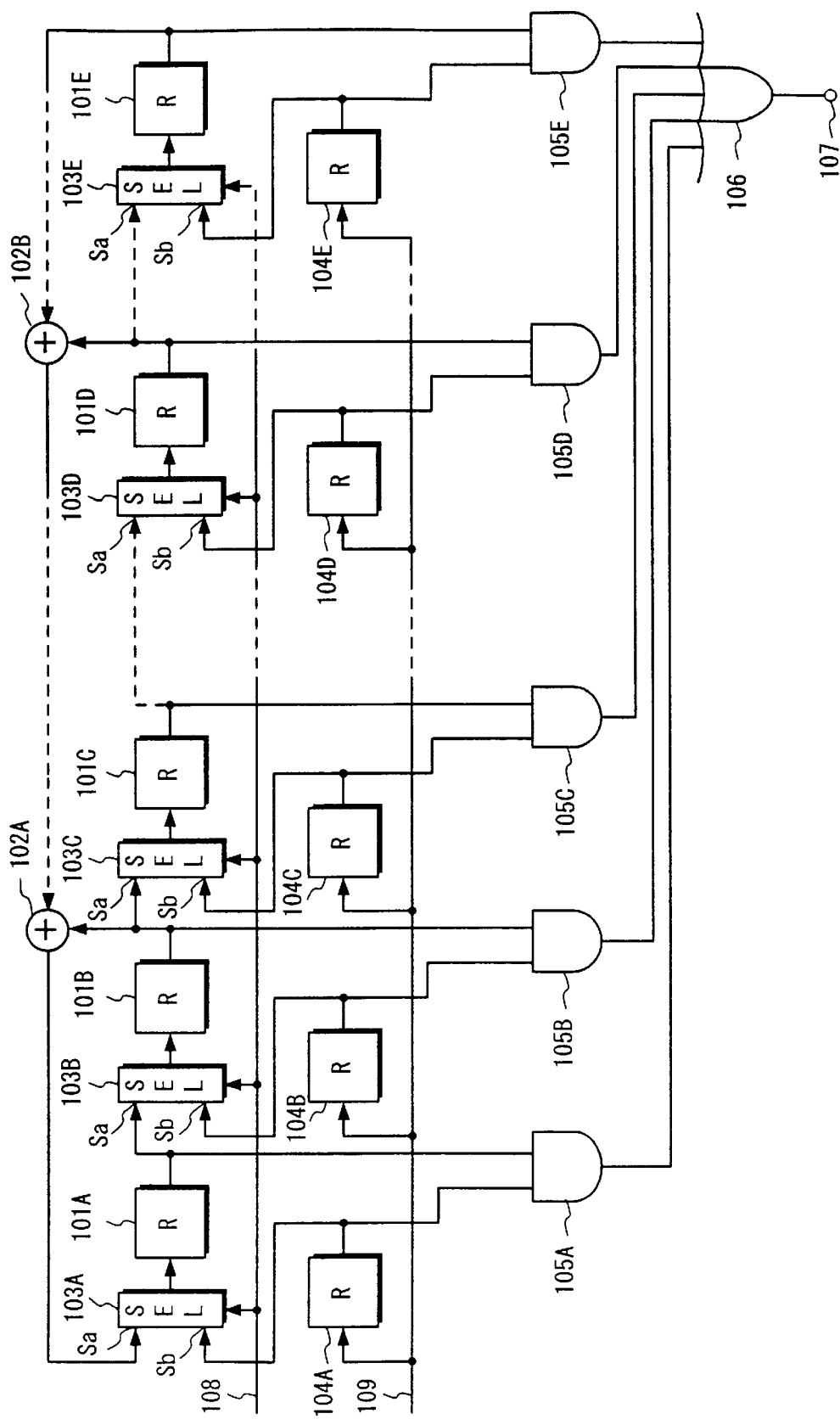
FIG. 4 is a block diagram showing an example of the structure of a PN code generating circuit of the portable telephone terminal unit of CDMA type according to the present invention.
Figure 5:
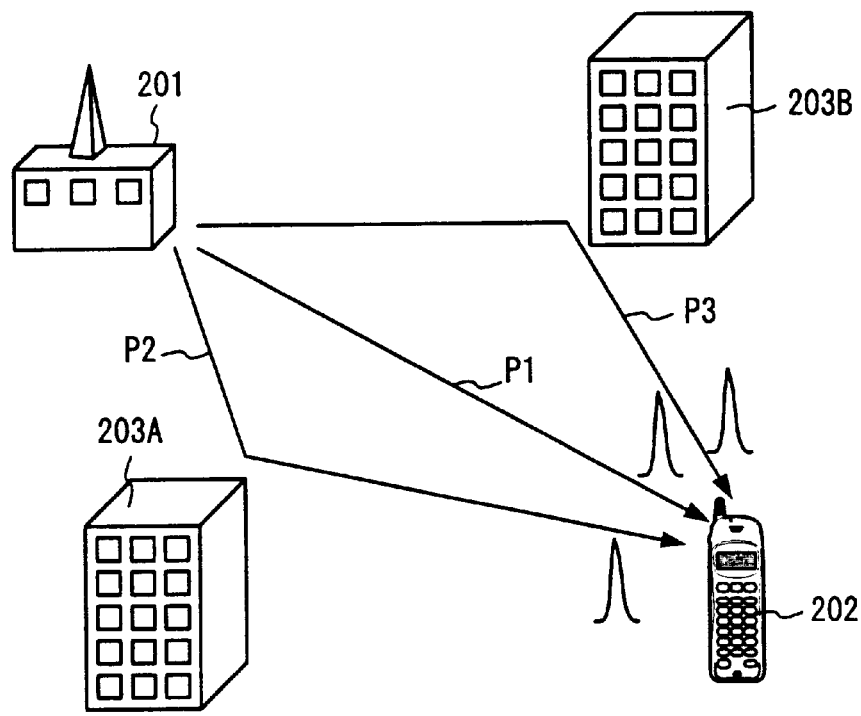
FIG. 5 is a schematic diagram for explaining multi-paths.
Figure 6:
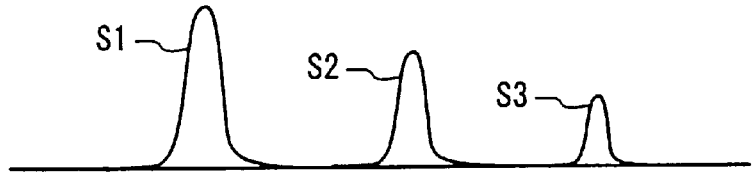
FIG. 6 is a schematic diagram showing a waveform for explaining multi-paths.
Figure 7:
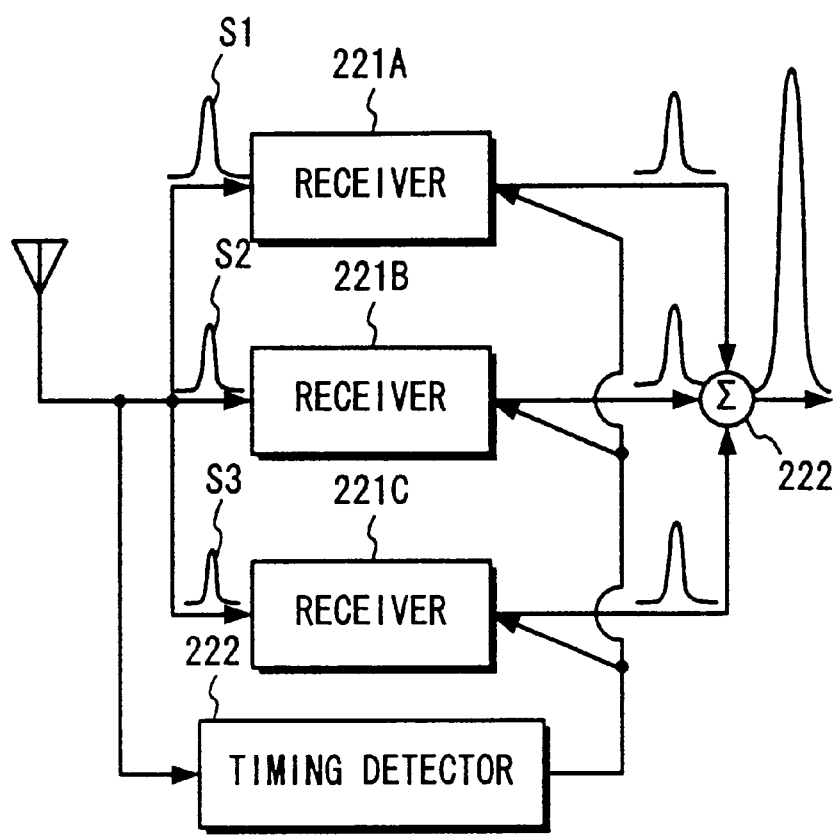
FIG. 7 is a block diagram for explaining a diversity RAKE system.
Figure 8:
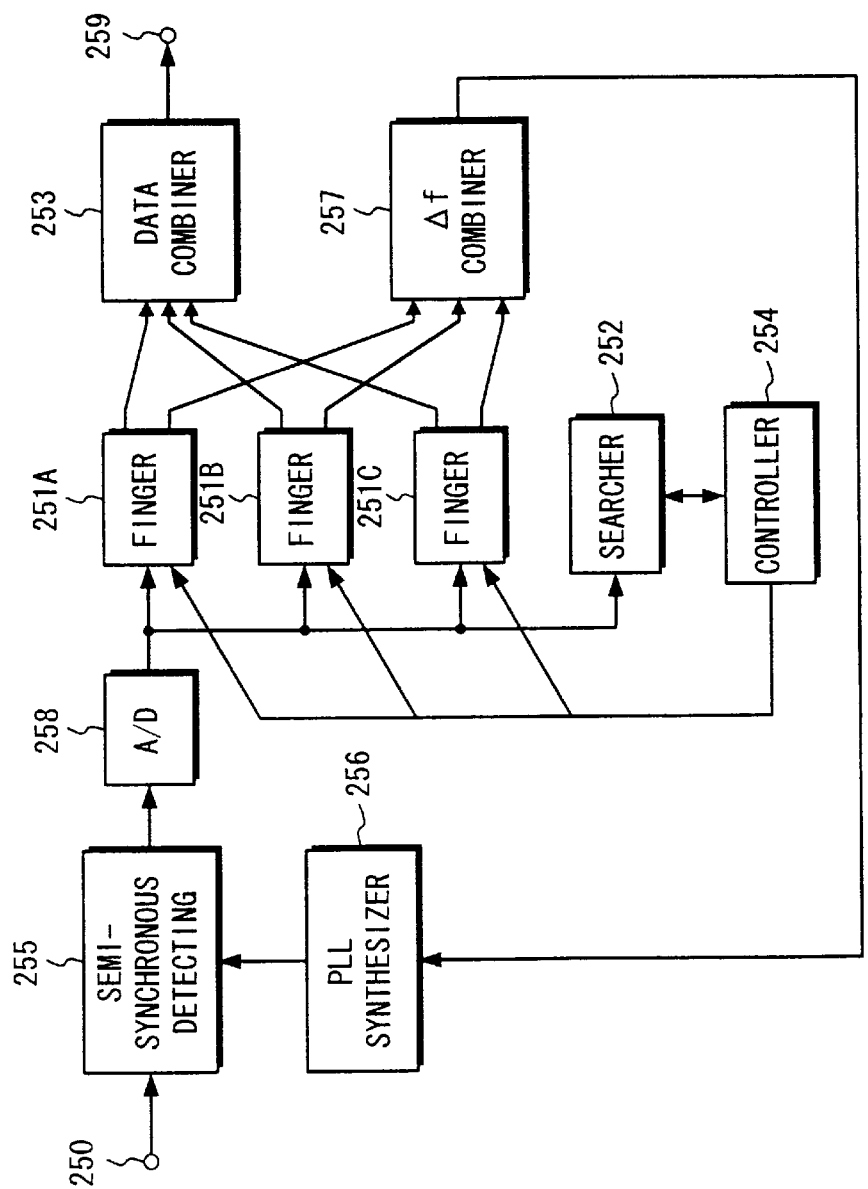
FIG. 8 is a block diagram showing an example of a receiver of the diversity RAKE system.
Figure 9:
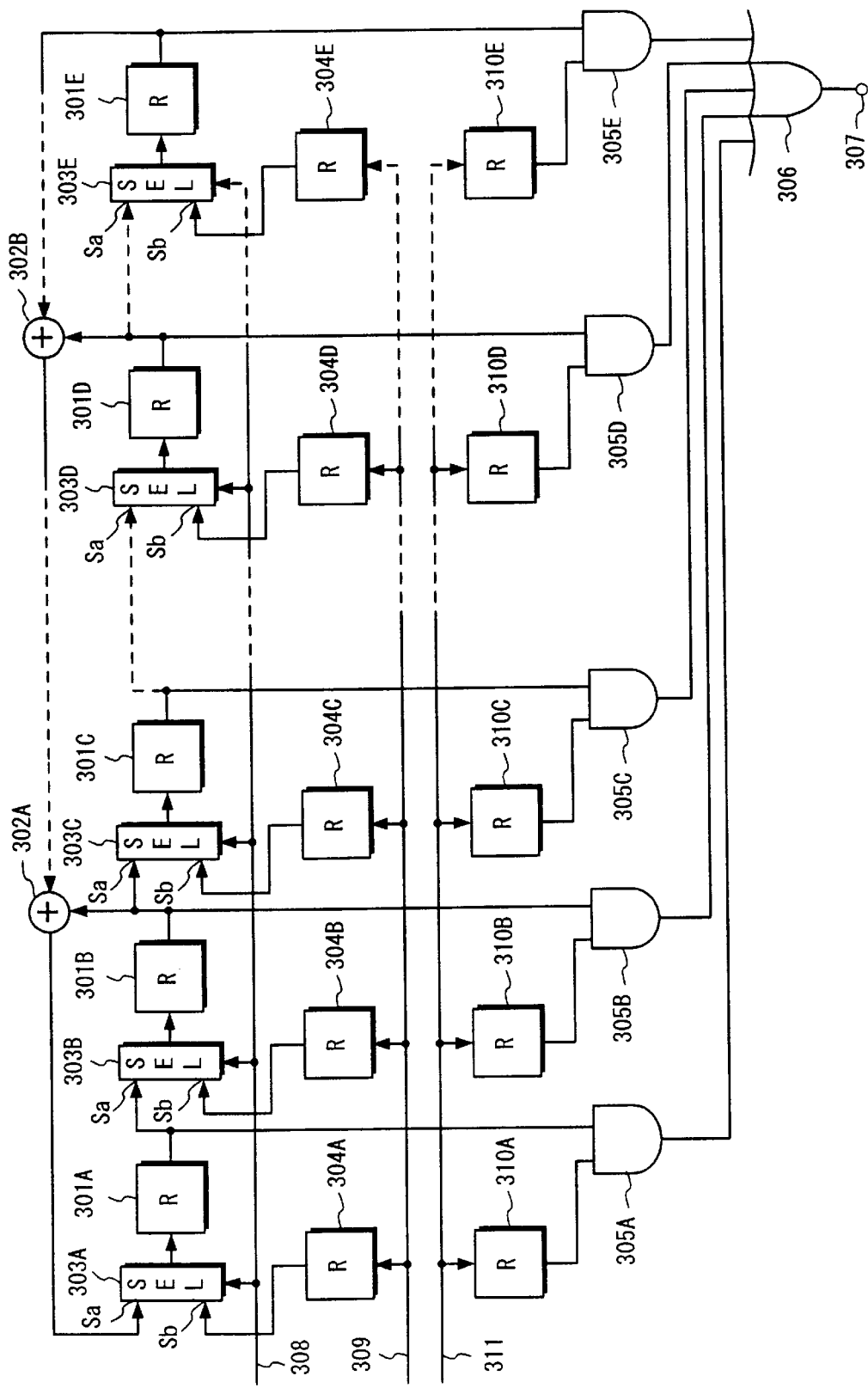
FIG. 9 is a block diagram showing an example of a conventional PN code generating circuit.

FIG. 4 is a schematic diagram showing a practical structure of the PN signal generating circuits 54 and 81 disposed in the searcher 28 and the fingers 25A, 25B, and 25C.

In FIG. 4, registers 101A, 101B, 101C, and so forth and modulo-2's adding circuits 102A and 102B form a linear feedback shift register. The registers 101A, 101B, 101C, and so forth are shift registers. The modulo-2's adding circuits 102A and 102B exclusive-OR tap output data of the shift registers and feedback loops thereof. Selectors 103A, 103B, 103C, and so forth are disposed as upstream circuits of the registers 101A, 101B, 101C, and so forth. A select signal is supplied to the selectors 103A, 103B, 103C, and so forth through a signal line 108. The select signal causes the selectors 103A, 103B, 103C, and so forth to be switched depending on whether data is loaded or a PN code is generated.

When data is loaded, load data is supplied to a data bus 109. The load data is temporarily stored in registers 104A, 104B, 104C, and so forth. When data is loaded, the selectors 103A, 103B, and 103C are switched to a terminal Sb thereof.

When the selectors 103A, 103B, 103C, and so forth are switched to the terminal Sb, the load data that has been temporarily stored in the registers 104A, 104B, 104C, and so forth is supplied to the registers 101A, 101B, 101C, and so forth and stored as initial data.

When the PN code is generated, the selectors 103A, 103B, 103C, and so forth are switched to a terminal Sa thereof. When the selectors 103A, 103B, 103C, and so forth are switched to the terminal Sa, the shift registers, which are the registers 101A, 101B, 101C, and so forth, and the modulo-2's adding circuits 102A and 102B form an M sequence generating circuit that generates a PN code.

AND gates 105A, 105B, 105C, and so forth and an OR gate 106 form a selector that selects the phase of a PN code. Tap output data of the registers 101A, 101B, 101C, and so forth is supplied to first input terminals of the AND gates 105A, 105B, 105C, and so forth. Output data of the registers 104A, 104B, 104C, and so forth is supplied to second input terminals of the AND gates 105A, 105B, 105C, and so forth. Output data of the AND gates 105A, 105B, 105C, and so forth is supplied to the OR gate 106. Output data of the OR gate 106 is obtained from an output terminal 107.

When a PN code is generated, mask data is supplied through the data bus 109. The mask data is temporarily stored in the registers 104A, 104B, 104C, and so forth. The mask data is supplied to the AND gates 105A, 105B, 105C, and so forth. Tap output data (mask data is "1") of the registers 101A, 101B, 101C, and so forth that generate a PN code is output from the output terminal 107 through the AND gates 105A, 105B, 105C, and so forth and the OR gate 106.

When data of the register 102A is "1" and data of the other registers 104B, 104C, and so forth is "0", tap output data between the registers 101A and 101B is obtained from the output terminal 107 through the AND gate 105A and the OR gate 106. When data of the register 104B is "1" and data of the other registers 104A, 104C, and so forth are "0", tap output data between the registers 101B and 101C is obtained from the output terminal 107 through the AND gate 105B and the OR gate 106. Thus, corresponding to the mask data, tap output data of the registers 101A, 101B, 101C, and so forth that generate a PN code is selected so as to designate the phase of the PN code.

According to the present invention, when initial data is set, load data is supplied through a data bus. The load data causes the initial data to be set to registers. When a PN code is generated, mask data for designating the phase of the PN code is supplied through a data bus. The mask data is stored in the registers. Thus, the registers that store the load data are shared with the registers that store the mask data. Thus, the circuit scale and power consumption can be reduced.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A pseudorandom noise (PN) code generating circuit comprising:

a shift register formed of a plurality of registers;

an adding circuit for exclusive-ORing tap output data of said shift register and feed-back tap output data of said shift register;

a plurality of selectors, disposed as upstream circuits of each of said plurality of registers forming said shift register, for switching respective input terminals depending on whether initial data is loaded to said shift register or mask data for generating a PN code is input;

phase designating means obtaining tap output data of said shift register corresponding to the mask data for designating a phase of a generated PN code; and data storing means for storing the initial data and the mask data, wherein when the initial data is set to said shift register, the initial data is stored in said data storing means and the initial data is set to each of said plurality of registers of said shift register through said plurality of selectors, and when the PN code is generated, said plurality of selectors send data stored in each of said plurality of registers of said shift register so as to generate the PN code and said data storing means stores the mask data, wherein tap output data of said shift register is selectively obtained corresponding to the mask data, and wherein the initial data and the mask data are sent to said data storing means through a common data bus.

* * * * *